(12) United States Patent
Goobar et al.

(10) Patent No.: US 8,867,579 B2
(45) Date of Patent: Oct. 21, 2014

(54) SEMICONDUCTOR LASER DEVICE

(71) Applicant: Finisar Sweden AB, Jarfalla (SE)

(72) Inventors: Edgard Goobar, Stockholm (SE);
Urban Eriksson, Bromma (SE);
Jan-Olof Wesstrom, Stockholm (SE)

(73) Assignee: Finisar Sweden AB, Jarfalla (SE)

( * ) Notice: Subject to any disclaimer, the term of this patent is extended or adjusted under 35 U.S.C. 154(b) by 29 days.

(21) Appl. No.: 13/721,487

(22) Filed: Dec. 20, 2012

(65) Prior Publication Data
US 2014/0177659 A1    Jun. 26, 2014

(51) Int. Cl.
*H01S 3/10* (2006.01)
*H01S 5/068* (2006.01)

(52) U.S. Cl.
CPC .................. *H01S 5/06817* (2013.01)
USPC ............ 372/20; 372/29.011; 372/29.015; 372/50.11; 372/29.02; 372/32

(58) Field of Classification Search
CPC ............ H01S 3/10053; H01S 3/1307; H01S 5/06266; H01S 5/06256; H01S 5/06806; H01S 5/06817; H01S 5/0687; H01S 5/125
USPC ........... 372/20, 29.011, 29.015, 50.11, 29.02, 372/32
See application file for complete search history.

(56) References Cited

U.S. PATENT DOCUMENTS

| | | | |
|---|---|---|---|
| 7,471,710 B2 | 12/2008 | Cliche et al. | |
| 7,620,081 B2 | 11/2009 | Shahine | |
| 2006/0153253 A1* | 7/2006 | Diffily et al. | 372/29.02 |
| 2013/0243015 A1* | 9/2013 | Eriksson et al. | 372/20 |

FOREIGN PATENT DOCUMENTS

SE    1051045 A1    4/2012

* cited by examiner

*Primary Examiner* — Kinam Park
(74) *Attorney, Agent, or Firm* — Young & Thompson

(57) ABSTRACT

A laser device (100) includes a laser (110; 210; 310; 410; 510) in turn including at least one Distributed Bragg Reflector (DBR) section (111), at least one phase section (112) and at least one gain section (113), further including a laser control element (150), a feedback control element (140) and a frequency noise discriminator (130,131), which feedback control element is arranged to feed a variable feedback signal to at least one of the at least one DBR section and the at least one phase section of the laser, so that the output laser frequency is altered in response to a variation in the feedback signal or the combination of respective feedback signals, whereby the feedback signal or combination of respective feedback signals is varied as a function of the detected frequency fluctuation so as to counteract the detected frequency fluctuation.

19 Claims, 7 Drawing Sheets

SEMICONDUCTOR LASER DEVICE

BACKGROUND OF THE INVENTION

1. Field of the Invention

The present invention relates to widely tunable semiconductor lasers of the DBR (Distributed Bragg Reflector) type, comprising at least one reflecting Bragg sections, at least one separate gain section and at least one phase section. Specifically, it relates to such a laser having reduced linewidth and frequency noise. The invention also relates to a method for reducing linewidth and frequency noise in a laser using DBR type reflectors.

2. Description of the Related Art

Conventionally, widely tunable lasers are used in Wavelength Division Multiplexed (WDM) optical transmission systems. As opposed to fixed wavelength lasers, tunable lasers can be used for several wavelengths, leading to for instance cost-efficient transmission equipment and simpler inventory management for system manufacturers. They also enable more advanced reconfigurable networks based on wavelength switching.

One group of such widely tunable lasers is the group of DBR based tunable lasers, such as DBR, MGY-DBR, SG-DBR, SSG-DBR, DS-DBR type lasers. Typically, they are made as monolithic single chips, without moving parts. This way, they can be made small and rugged. Their tunability across a broad frequency spectrum is due to a complex interplay between their Bragg section(s) and a phase section. In general, Bragg current(s) need(s) to be selected in order to define the lasing wavelength. Also, a phase current needs to be selected in order for the optical length of the laser cavity to match this lasing wavelength, so that high-power, stable lasing can be achieved. To tune the laser, the Bragg and phase currents are then adjusted simultaneously to alter the lasing wavelength. Different Bragg currents, or combinations of Bragg currents, yield locally tunable lasing within frequency intervals which are quite disparate in relation to each other. In different such tuning intervals, the properties of the laser can be different in terms of for instance the output frequency response to a small change in one of the control currents. A gain current must also be applied. DBR lasers and their tuning is described for instance in SE 1051045 A1.

Herein, the term "DBR laser" is to be understood so as to comprise all lasers using at least one DBR type reflector. Hence, the above described types of DBR lasers are non-limiting examples of such lasers. Furthermore, herein a "Bragg" section is used to denote a DBR section.

A main drawback of the DBR based laser is its relatively large frequency noise and linewidth. Especially in coherent communication system, where the information is both amplitude- and frequency modulated on the carrier light wave, this may constitute a problem. It has proven difficult to efficiently reduce the linewidth of DBR lasers, due to their complex structure.

The present invention provides a way to reliably and efficiently reduce the linewidth of DBR lasers across a wide range of lasing frequencies.

For DFB (Distributed FeedBack) lasers, negative electrical feedback to the gain laser material has been proposed to decrease the laser linewidth, for instance in U.S. Pat. No. 7,471,710 and U.S. Pat. No. 7,620,081. DFB lasers have the advantage of having a relative low linewidth, typically in the order of 10 times narrower than for a DBR laser, but are not tunable across as large a frequency range as DBR lasers. However, the findings described in these prior art documents are not applicable to DBR lasers because of a number of differences between DFB and DBR lasers.

Namely, DFB lasers typically consist of a single amplification-providing section, to which the negative feedback signal is applied. The carrier density in such a section is clamped, resulting in a certain self regulation according to which the linewidth decreases with increased output power. A DBR laser includes at least two passive sections which lack this type of self regulation, and the carrier density is therefore free to fluctuate.

Due to the gain clamping mechanism, the frequency modulation response in the gain section is dominated by the red-shifting temperature dependence of the refractive index up to frequencies in the range of around 1 MHz. Beyond this frequency, the frequency modulation response is dominated by the change of the refractive index vs. carrier density. These two effects are 180° out of phase, such that a feedback loop configured for negative feedback at frequencies below 1 MHz will turn into positive feedback at frequencies above 1 MHz.

BRIEF SUMMARY OF THE INVENTION

Thus, the invention relates to a laser device comprising a laser in turn comprising at least one Distributed Bragg Reflector (DBR) section, at least one phase section and at least one gain section, wherein the laser device further comprises a laser control means, arranged to feed respective tuning currents to the said at least one DBR section, to the said at least one phase section and to at least one gain section in order to tune the laser, wherein the laser device further comprises a feed-back control means, wherein the laser device further comprises a frequency noise detector in communication with said feedback control means, arranged to detect a frequency fluctuation in a light beam output from the laser and to communicate a signal representing the frequency fluctuation to the feedback control means, which feedback control means is arranged to feed a respective variable electric feedback signal to at least one of said at least one DBR section and said at least one phase section of the laser, so that the output laser frequency is altered in response to a variation in the feedback signal or the combination of respective feedback signals, whereby the feedback signal or combination of respective feedback signals is varied as a function of the detected frequency fluctuation so as to counteract the detected frequency fluctuation.

It also relates to a method for reducing linewidth and frequency noise in a laser device comprising a laser in turn comprising at least one Distributed Bragg Reflector (DBR) section, at least one phase section and at least one gain section, which laser device further comprises a laser control means, arranged to feed respective tuning currents to the said at least one Bragg section, to the said at least one phase section and to at least one gain section in order to tune the laser.

BRIEF DESCRIPTION OF THE DRAWINGS

In the following, the invention will be described in detail, with reference to the enclosed drawings, wherein.

DETAILED DESCRIPTION OF THE PREFERRED EMBODIMENTS

Figure 1A:
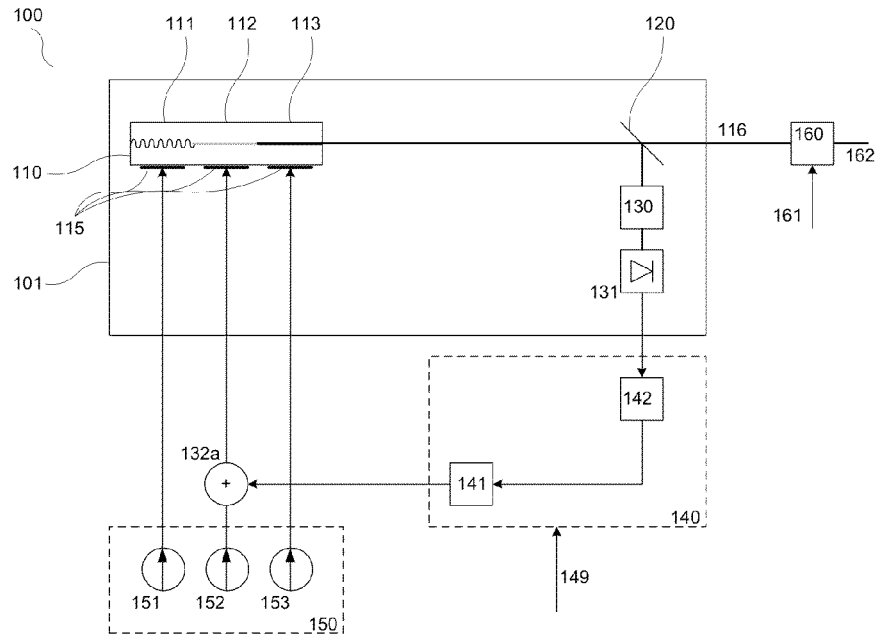
FIG. 1a and FIG. 1b illustrate two examples of the operation principle of a DBR laser device according to a respective first and second embodiment.
Figure 1B:
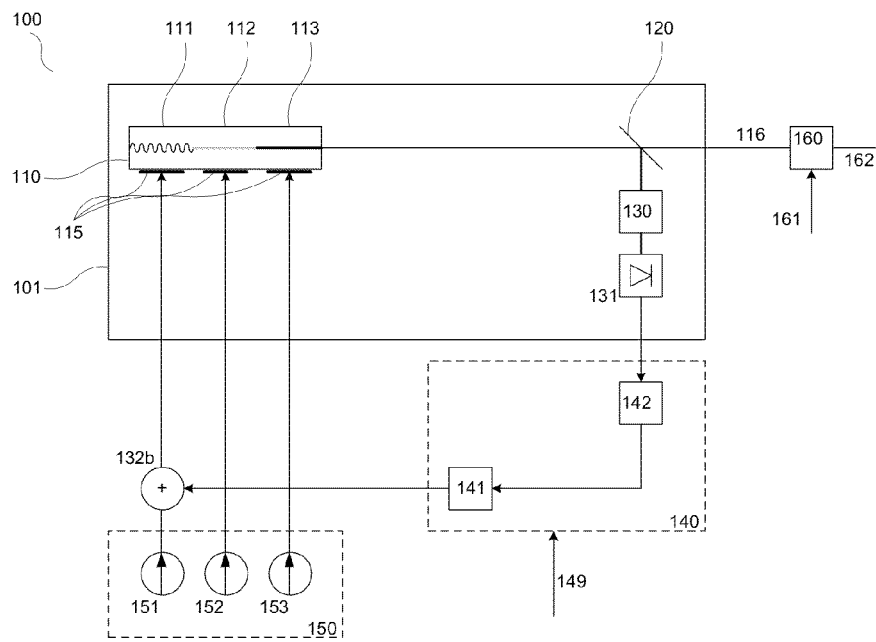

FIGS. 1a and 1b illustrate schematically two exemplary embodiments of a Distributed Bragg Reflector (DBR) laser device 100 according to the invention, comprising a DBR laser 110, a laser control means 150 and a feedback control means 140. The laser 110 in turn comprises at least one Bragg section 111, at least one phase section 112 and at least one gain section 113. FIGS. 1a and 1b are identical, except for current summing means 132a and 132b (see below), and share the same reference numerals for like parts.

101 represents an integrated semiconductor optical circuit, preferably in the form of a single optical sub-assembly.

Throughout the description, the invention is described as if the laser control means 150 and the feedback control means 140 are separate entities. This may or may not be the case, and as the skilled person will realize, they may also be represented by different functionality in one and the same control circuitry in practical applications.

The laser control means 150 is arranged to feed, using tuning control current sources 151, 152, 153, respective tuning currents to the said at least one Bragg section 111, to at least one of said at least one phase section 112 and to said at least one gain section 113, in order to tune the laser to a certain WDM channel, at a specific frequency and a specific output power. The different currents are supplied to the laser 110 sections 111-113 via respective electrodes 115. The control of the tuning currents supplied to the different sections 111-113 is conventional as such, and is described for instance in SE 1051045 A1.

A frequency noise discriminator 130, 131 is arranged to communicate with the feedback control means 140 and to detect a frequency fluctuation in a light beam 116 output from the DBR laser 110. The said discriminator 130, 131 is also arranged to communicate a signal representing the frequency fluctuation to the feedback control means 140.

According to a preferred embodiment, a light splitter 120 is arranged to feed part of the light beam 116 to the discriminator 130, 131, which preferably comprises a frequency discriminator means 130 and a light intensity detector means 131.

The frequency discriminator means 130 may for instance be a Fabry-Perot etalon, used for locking the frequency to a WDM channel (that is, a wavelength locker), or a Mach-Zehnder or a Michelson interferometer. It is arranged to read light output from the laser 110 and to convert a light frequency change into an intensity change in an output light beam which is fed to the light intensity detector means 131.

The means 131, in turn, may be a conventional photo detector or an avalanche photo-diode, and is arranged to read the light beam output from the frequency discriminator means 130 and to convert a detected light intensity change in the said read light beam into a change in a output electrical signal, which is then communicated to the feedback control means 140 as a signal representing the said frequency fluctuation.

According to the invention, the feedback control means 140 is then arranged to feed a respective variable electric feedback signal to at least one of said at least one Bragg section 111 and said at least one phase 112 section of the DBR laser 110, preferably either exactly one Bragg section 111 or exactly one phase section 112, preferably only to one phase section 112. The variable feedback signal or combination of variable feedback signals are selected so that the output laser frequency is altered in response to a variation in the feedback signal or the combination of feedback signals. Moreover, the feedback signal or combination of feedback signals is varied as a function of the detected frequency fluctuation so that the changes in laser 110 output frequency, due to said feedback signal or signals, counteract the frequency fluctuation detected by the frequency noise discriminator 130, 131.

Hence, respective feedback signals may be applied to either one or several Bragg sections, to one or several phase sections, or to a combination of one or several Bragg and one or several phase sections. In the following, Bragg and phase sections will collectively be denoted "passive" sections, since they, as opposed to gain sections 113, are not active in the sense that they do not contribute to any gain in the laser light.

The feedback control means 140 thus comprises analog and/or digital electronics (see below) arranged to apply an electrical feedback signal to at least one passive section of the laser 110 with the aim of suppressing the frequency noise in the output light beam 116. In order to suppress this noise, it is preferred that the feedback signal to some extent oscillates in reverse phase in relation to detected frequency fluctuations, in other words it is a negative feedback signal. However, since the frequency modulation response of a DBR laser is typically non-linear, it is important that the electric feedback signal fed to the passive section 112 also provides the right amount of magnification and the appropriate phase characteristics to efficiently suppress the said noise without causing oscillations in the feedback system.

The variable electric feedback signal can be a feedback current fed to the passive section in question, altering the frequency of the laser. Alternatively, the variable electric feedback signal can be a variable feedback reverse bias voltage applied to the passive section in question, with a similar result. In the latter case, for a reverse biased passive section the electro-optic effect is used instead of current injection to achieve frequency modulation. This will put higher amplification demands on the individual components in a device according to the invention, but on the other hand the modulation response can reach several GHz, depending on the high frequency design of the chip and its peripherals.

Which magnification and phase characteristics to use in the feedback signal is highly dependent on at least the characteristics of the DBR laser 110 and the characteristics of the feedback system 130 itself, 131, 140. Therefore, these properties of the feedback control means will have to be determined experimentally. However, what is important is that the present inventors have surprisingly discovered that it is possible to use negative feedback via one or several passive sections of a DBR laser to suppress frequency fluctuations, notably that it is not necessary to provide a negative feedback signal to all tuned sections of the laser 110, including the gain section 113.

In fact, using only passive sections, a larger negative feedback bandwidth can be achieved. Namely, the frequency modulation response has a blue shifting characteristic from DC up to its roll off frequency, which for current modulation normally is at several tens of MHz and for high biasing currents would even reach hundreds of MHz and for voltage modulation I in the GHz regime.

As compared to the DFB laser case, injecting a corrective current into the gain material affects both the intensity and the frequency of the DFB laser, requiring higher complexity in the laser circuitry. By feeding back only to passive sections, the laser light intensity is not, to first order, affected, whereby the laser control circuitry can be made less complex.

Even though Bragg and phase sections have different functions in a DBR laser, they both react to a small change in injected current by altering the lasing frequency according to predetermined respective functions. It is preferred that the frequency noise of the laser beam 116 which is corrected by the present invention has an amplitude which is less, preferably significantly less, than the largest frequency shift which may typically be imparted to the laser beam 116 light, by altering one or several of the tuning currents fed to passive sections, without risking a mode hop of the laser 110 when the laser 110 starts from a stable lasing mode.

FIG. 1a illustrates a method in which the feedback current is fed from the feedback control means 140, via summing means 132a, to the phase section 112. In FIG. 1b, the feedback current is instead fed via summing means 132b, to the Bragg section 111. As is understood from the above, the basic principle of operation is similar regardless of which type or types of passive section or sections are used for the feedback loop.

Since the laser 110 is widely tunable, attention must be paid to the fact that various components of the feedback loop have non-linear characteristics. For instance, the locking point of laser 110 will, for different lasing channels, occur at different points along the transmission function slope of a Fabry-Perot interferometer used as the discriminator 130. Since the frequency demodulation sensitivity of the etalon varies across a wide spectrum of frequencies, it will be different for different channels.

Figure 7:
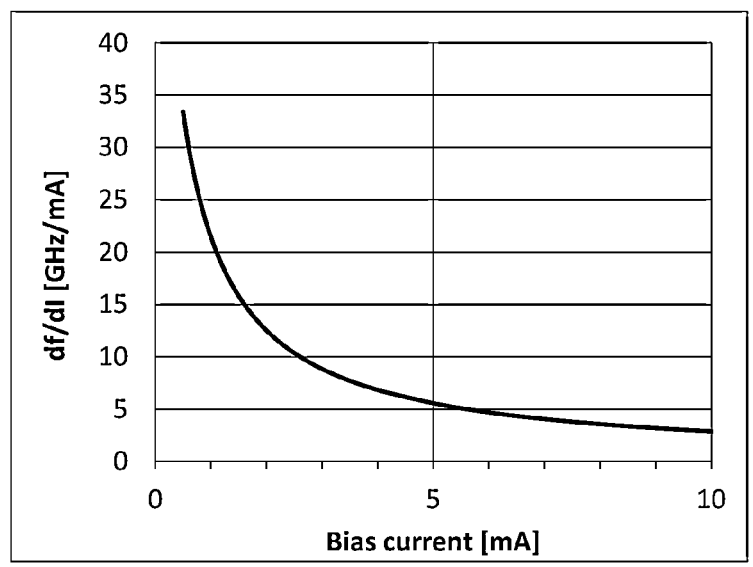
FIG. 7 is a graph showing the laser frequency modulation response as a function of DC bias of a passive section in a DBR laser.

Similarly, the amplitude of the frequency modulation response of the laser 110 depends strongly on the DC-current level (or bias current) provided to a passive section, as can be seen in FIG. 7, which depicts the laser frequency shift resulting from a unit change in the bias current fed to a certain phase section as a function of the absolute bias current value. In an analog manner, the phase characteristics of the laser light also depend on the absolute value of the bias current. Since each laser channel has its specific current setting for a certain passive section, the effect of a change in the feedback current in terms of laser gain and phase characteristics will be different for different WDM lasing channels for each passive section.

Furthermore, the responsivity of the detector 131 is typically also weakly wavelength dependent.

Hence, the gain and phase characteristics of a feedback loop used to achieve a decreased linewidth of a DBR laser will depend upon the lasing frequency currently used, at least if the feedback signal is applied to a passive section which is also used for tuning the DBR laser.

Figure 6:
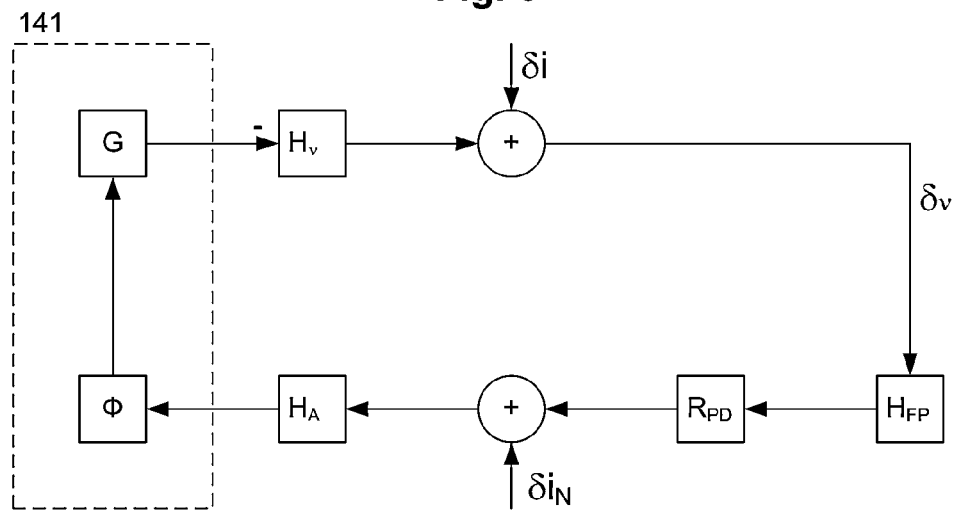
FIG. 6 is an outline diagram showing a feedback system according to the invention including a DBR laser.

FIG. 6 shows a simplified schematic description of the feedback system as shown in FIGS. 1a and 1b. A noise source with fluctuation amplitude $\delta i$ generates a frequency fluctuation with amplitude $\delta v$. The Fabry-Perot etalon 130 with optical frequency dependence $H_{FP}(v)$ acts as a frequency discriminator such that the frequency noise is converted into intensity noise by the photodetector 131 with responsivity $R_{PD}(v)$.

The photodetector 131 is connected to a front end amplifier 142 with transfer function $H_A$, and in conjunction with this detection noise $\delta i_N$ is introduced. This detection noise is caused by for instance the thermal Jonsson Noise, shot-noise and noise coming from the front end amplifier 142.

The signal after the front end amplifier 142 needs to be preconditioned with the appropriate phase and magnification before being fed back to the passive section 111 or 112 of the laser 110, using logic variable phase correction $\Phi$ and variable gain correction G elements, respectively. Finally, the passive laser 110 section 111 or 112 itself has the frequency modulation transfer function $H_v(\omega(v))$.

Thus, there are three elements in the feedback loop transfer functions of which depend on the optical frequency, in other words on the selected WDM channel for the laser 110, namely the Fabry-Perot interferometer 130, the laser 110 itself, and to some extent the responsivity of the photo detector 131, especially when using an avalanche photo diode with $R_{PD} > 1$.

Thus, the open loop feedback transfer function is:

$$H_{OL} = R_{PD} P_{in} H_{FR} H_A H_v,$$

wherein $P_{in}$ is the optical power input into the FP etalon.

It can be shown that, under electrical feedback, the frequency noise power spectral density (PSD) $S_v^{FB}(f)$ is:

$$S_v^{FB}(f) = \frac{S_v^{FR}(f)}{|1 + H_{OL}|^1} + \frac{\partial i_W}{|R_{PD}(f) P_{in} \cdot H_{PD}(v)|^2},$$

where $$S_v^{FR}(f)$$

is the PSD in the free running case.

Figure 8:
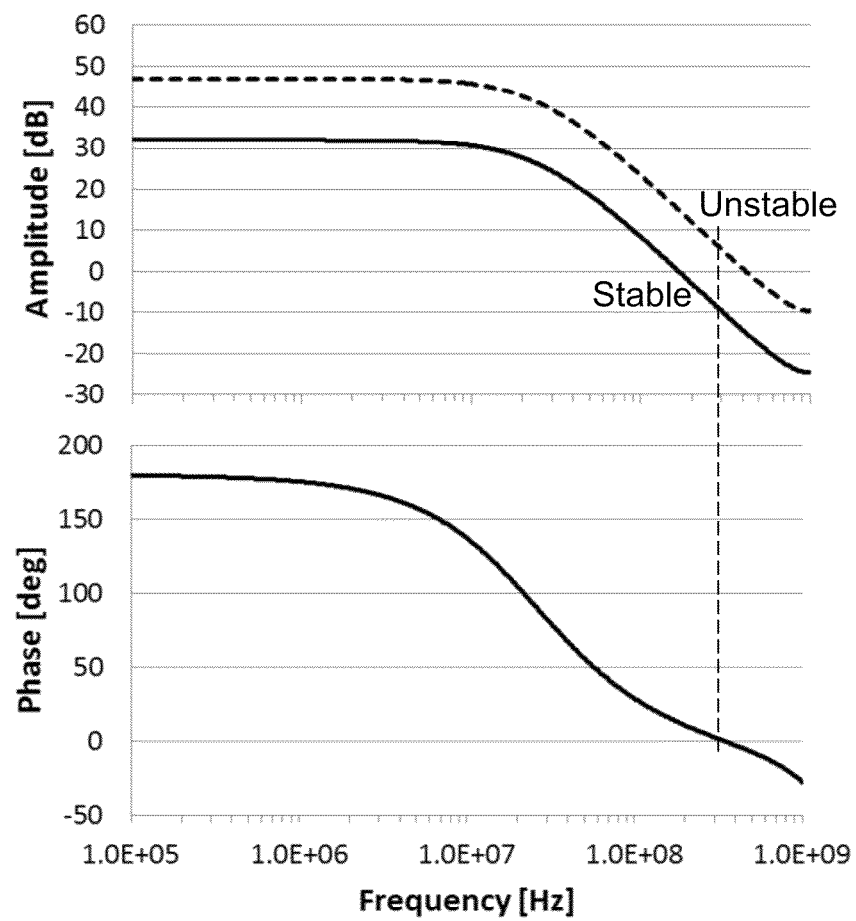
FIG. 8 is a graph showing the open loop transfer function of the feedback system shown in FIG. 6.

In order to achieve reduction of the noise PSD and the linewidth of the laser 110, high feedback gain is required. However, care must be taken with the stability of the feedback system. FIG. 8 shows the open loop feedback transfer function (upper graph: amplitude; lower graph: phase) for an exemplary feedback loop comprising a laser 110. The solid amplitude curve is lower than 1 when the phase curve reaches 180 degrees rotation, and fulfills therefore the requirements for stability when the loop is closed. In the dashed line, which has a higher gain, the feedback loop however starts to oscillate at about 300 MHz in order for the system to be stable. Thus, due to the strong current dependent frequency modulation sensitivity in the passive tuning sections of the laser 110, different WDM channels will require different settings for the gain G and phase Φ correction elements in order to achieve low linewidth and good stability.

According to a preferred embodiment, as shown in FIGS. 1a and 1b, the feedback control means 140 is arranged to, via summing means 132a or 132b, apply at least one of said feedback current or currents to a certain respective one of said Bragg 111 or phase 112 sections in addition to a tuning current that the laser control means 150 is arranged to feed to the said Bragg 111 or phase 112 section with the purpose of matching a presently used set of tuning current or currents applied to the laser 110 so as to achieve a certain lasing frequency, which frequency preferably belongs to a grid of standardized WDM channels.

It is furthermore preferred that the feedback control means 140 is arranged to receive a signal 149 representing the presently used WDM channel of the laser 110 and/or the current lasing frequency, and that the feedback control means 140 is arranged to vary the said feedback current or combination of feedback currents so that each respective feedback current amplitude, and preferably also the phase characteristics of each respective feedback current, as described above, depends on the presently used WDM channel and/or frequency. With respect to said phase characteristics, it is in particular preferred that the phase delay between the frequency fluctuations detected in the light beam 116 and each respective feedback current fed into the passive section 111, 112 is determined as a function of the currently used lasing WDM channel. It is also preferred that the amplitude and/or phase characteristics of the feedback signal is determined based upon a known relationship between currently used lasing frequency and the transfer functions of other components 130, 131, 142 in the feedback loop apart from the laser 110 itself.

The variable phase Φ and gain G logic units in the feedback circuit can be implemented as circuits in analog electronics, or using digital signal processing.

Figure 9:
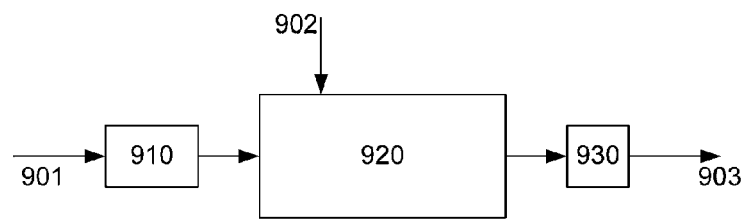
FIG. 9 is a first exemplary circuit diagram of a feedback system according to the invention.

FIG. 9 illustrates schematically a first exemplary structure of a control circuit 141 for implementing logic units Φ and G (see FIGS. 1a, 1b and 6). The analog signal 901 from the amplifier 142, which signal 901 represents the detected frequency fluctuation, is received by an Analog to Digital Converter (ADC) 910, which samples signal 901 and sends it, in digital form, to a digital processor part 920. The processor part 920 comprises digital filters in a computing unit, implementing the variable gain and variable phase. The computing unit, which is conventional as such and can be implemented in an ASIC (Application Specific Integrated Circuit), a FPGA (Field Programmable Gate Array) or a DSP (Digital Signal Processor), receives an input signal 902, corresponding to signal 149 and carrying information regarding the currently used WDM channel and/or the currently used lasing frequency, and bases the computation of the gain and phase corrections upon the value of the signal 902 in combination with predetermined knowledge about the feedback loop and in particular the previously measured and tabulated behavior of the laser 110 in response to gain and phase changes at different WDM channels. In other words, the digital processor part 920 is arranged to continuously calculate the value of the feedback current or combination of feedback currents based upon the sampled signal and the currently used WDM channel and/or frequency of the laser.

Finally, the calculated feedback signal is again transformed into an output analog current signal 903 by a Digital to analog converter (DAC) 930, thereby continuously producing the feedback current or combination of feedback currents to be applied to the passive section 111 or 112 via 132a or 132b.

Figure 10:
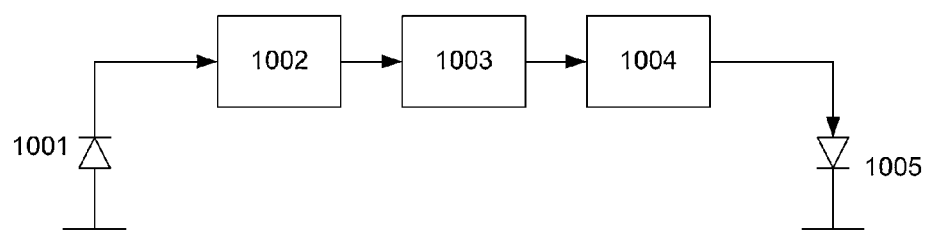
FIG. 10 is a second exemplary simplified circuit diagram of a feedback system according to the invention.

FIG. 10 shows, in a simplified block diagram, a second exemplary structure of a control circuit 141 according to the invention, which comprises analog electronic feedback circuitry. Light is captured by a photo detector 1001, which corresponds to photo detector 131. The photocurrent is then fed into a low noise front end amplifier 1002, the purpose of which is to amplify the detected frequency fluctuations without adding noise. The signal output from the front end amplifier 1002 is then fed into an amplitude and phase conditioning network 1003, with the purpose to compensate or correct for the amplitude- and phase characteristics of the front end amplifier 1002 and the laser, and to ensure the stability of the feedback loop. Finally, output stage 1004 is arranged to accept an output signal from the integrating network 1003 and on its output provide laser bias independent feedback amplification to the laser tuning section 1005, corresponding to section 112 in FIG. 1.

The front end amplifier 1002 can be implemented as a trans-impedance amplifier (TIA) or as an integrating high impedance amplifier. A TIA typically has a flat transfer function up to the frequency where a double pole in the complex plane occurs (See for example data sheet for Texas Instruments OPA657, http://www.ti.com/lit/ds/symlink/opa657.pdf). Beyond this frequency, the transfer function falls by 40 dB/decade, and the phase suffers a rotation of 180°. If the phase reaches 180° while the loop gain is larger than unity, the control system will become unstable. To avoid instability, the amplitude and phase conditioning circuit 1003 should be designed to correct for this double pole, for example by introducing a zero. This will reduce the amplitude slope to 20 dB/decade but will also limit the phase rotation to 90°, which will restore stability to the control loop.

An integrating front end amplifier has a relatively low frequency pole determined by the parasitic capacitance of the photo diode and the high input resistance value. Beyond this frequency, the front end behaves like an integrator with a slope of 20 dB/decade and a phase rotation of 90°, which renders stable characteristics, as explained above. On the other hand, a zero can be introduced with the amplitude and phase conditioning circuit 1003 in order to extend the flat response beyond the pole of the integrating amplifier 1002.

Other purposes of the amplitude and phase conditioning circuit circuit 1003 comprise to compensate for the roll off encountered in the transfer function of the laser tuning section, and to adjust the amplification of the control loop. These two functions can be implemented using variable gain amplifier designs and/or using networks implemented with potentiometers such that the RC-constants of the circuit can be tuned, preferably in a digital fashion. These two functions are important since different laser biases will render different laser bandwidth and tuning efficiency.

Figure 11:
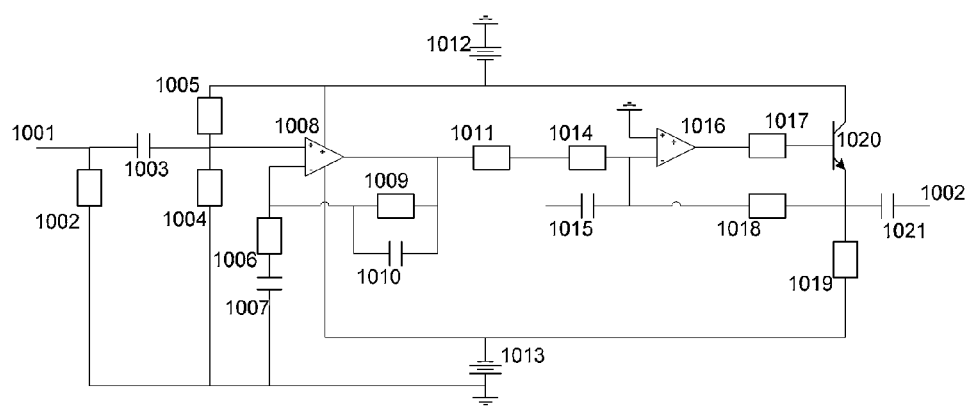
FIG. 11 is a detailed view of the circuit diagram shown in FIG. 10.

FIG. 11 is a detailed view of a control circuit 141 such as the one shown schematically in FIG. 10, which comprises analog circuitry in turn comprising a low pass filter (operation amplifier 1008 with related resistors and capacitors), an amplitude and phase conditioning step (operation amplifier 1016 with related resistors and capacitors), and an amplification step (emitter following transistor step comprising transistor 1020).

An analog input signal, representing the detected frequency fluctuation, enters on a terminal 1101, and the corrected feedback signal exits on terminal 1102 in the form of an analog current to be fed to the passive section 111, 112.

According to a preferred embodiment, it is the properties of the amplitude and phase conditioning step which are varied depending on the currently used lasing frequency or WDM channel of the laser 110.

Operation amplifier 1108 is connected as a non-inverting amplifier, and has a first order low pass filter characteristic. Operation amplifier 1116 is connected as a derivative network. A typical DBR laser has a transfer function which is similar to a first order low pass filter, with a pole the frequency of which depends on the DC current bias used. Since different selected frequencies or WDM channels have different DC current settings, the frequency of the pole will depend on the used WDM channel. With this in mind, the derivative network is designed with a zero point which is selected so as to compensate for the said pole in the laser 110 transfer function.

The purpose of the emitter following transistor step 1120 is to achieve an amplification of the signal which is independent of the laser impedance.

In order to adapt the gain G and phase $\Phi$ of the output signal, for instance resistors 1114 and 1118 can be made variable and set to suitable values depending on the desired gain G and phase $\Phi$. Alternatively, resistor 1118 and capacitor 1115 can be made variable and varied with the same purpose.

1112 and 1113 are current sources. The following table shows an exemplifying set of resistor and capacitor dimensions for use in a particular exemplary case, but the skilled person realizes that the values given need to be adapted to each specific case in order to fully achieve the advantages of the present invention:

| Resistor | resistance ($\Omega$) | Capacitor | capacitance |
|---|---|---|---|
| 1102 | 5200 | 1103 | 100 nF |
| 1104 | 60000 | 1107 | 10 µF |
| 1105 | 60000 | 1110 | 120 pF |
| 1106 | 270 | 1115 | 68 pF |
| 1109 | 270 | 1121 | 1 µF |
| 1111 | 39 | | |
| 1114 | 150 | | |
| 1117 | 50 | | |
| 1118 | 25 | | |
| 1119 | 1000 | | |

Figure 2:
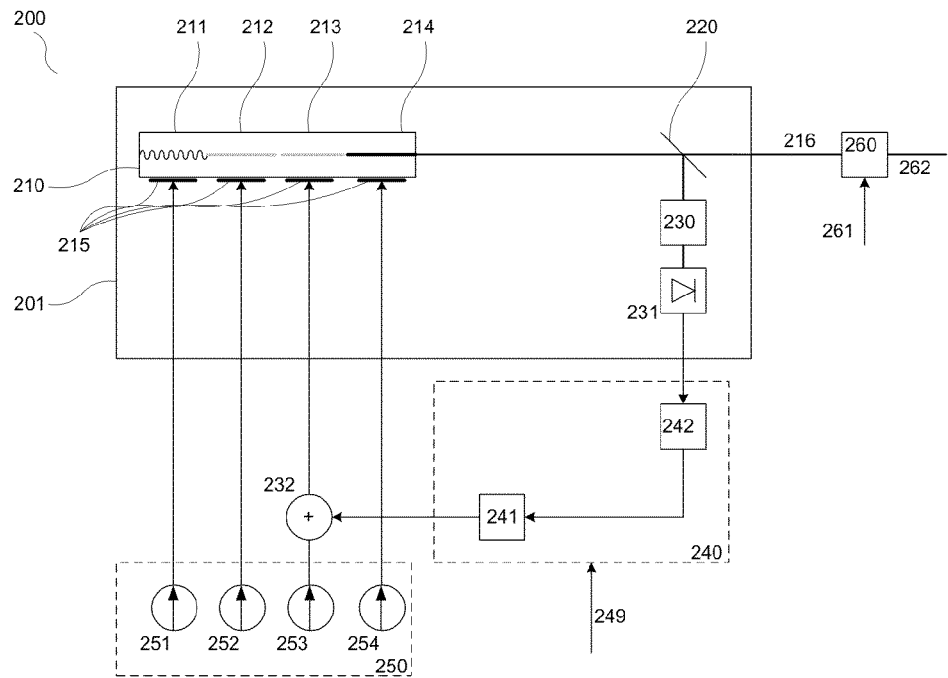
FIG. 2 illustrates the operation principle of a DBR laser device according to a third embodiment, with a dedicated passive feedback section.
Figure 3:
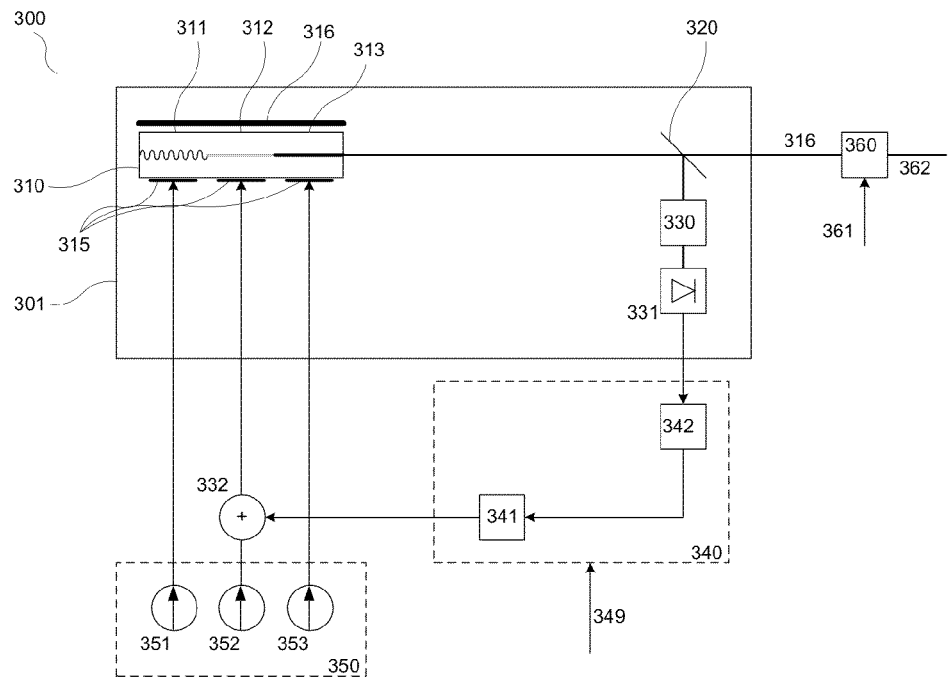
FIG. 3 illustrates the operation principle of a DBR laser device according to a fourth embodiment, with temperature control.

FIGS. 2 and 3 show other preferred exemplary DBR laser devices 200, 300 according to the invention. Most of the parts in devices 200, 300 are identical to those in device 100. They also share the corresponding last two digits in each respective reference numeral. Therefore, for reasons of simplicity, only the differences between FIGS. 2 and 3 are touched upon here. The corresponding applies to FIGS. 4 and 5, which relate to embodiments that may be combined with those of FIGS. 1a-3.

Thus, FIG. 2 illustrates a DBR laser 210 comprising four sections—a Bragg section 211; a phase section 212 which is used for tuning the laser 210; a phase section 213 which is not used for tuning the laser 210 but which may be fed, by current source 253, with a constant current setting; and a gain section 214. Hence, the feedback control means 240 is arranged to feed the feedback current to a certain one 213 of said phase sections 211, 213 to which the laser control means 253 is not arranged to apply a tuning current with the purpose of matching a presently used set of tuning current or currents applied to the laser 210 so as to achieve a certain lasing frequency, which preferably belongs to a grid of standardized WDM channels.

Since the phase section 213 is not used for tuning the laser 210 to a specific WDM channel, the frequency response to a changed feedback current is independent of the currently used lasing frequency or WDM channel. Therefore, G and $\Phi$ need not be changed to reflect changes in a transfer function of the laser 210 itself in response to a change of WDM channel, which simplifies the control circuit 241.

In FIG. 2, a signal 249 corresponding to signal 149 (above) is sent to the feedback control means 240, but this is not strictly necessary. In fact, according to a preferred embodiment, no information regarding the currently used laser frequency is fed to the feedback control means 240. As the largest impact on the feedback loop transfer function is usually from the laser 210 itself, a sufficiently exact feedback current signal can often be achieved independently of the current WDM channel using a setup as the one of FIG. 2. The corresponding applies to FIG. 3 and the signal 349 (see below).

FIG. 3 shows an alternative way to achieve the same effect as in FIG. 2. Instead of having a separate phase section 213, the DBR laser 310 comprises only one Bragg section 311, one phase section 312 and one gain section 313, and the feedback current is fed, via summing means 332, to the phase section 312 used for tuning the laser 310. However, the laser 310 is actively temperature controlled, using a temperature control means 316, such as a peltier cooler or the corresponding, arranged to control the temperature of the laser 310 so that the optical cavity length of the phase section 312 is modified to match a set of tuning currents applied to the laser 310 so as to achieve a certain lasing frequency to which the laser 310 is tuned. Hence, the temperature control means 316 is used instead of a tuning current to adjust the optical cavity length of the said certain one phase section in order to match a used WDM channel. A current source 352 can supply a desired constant current to phase section 312.

This way, WDM channel independency of the transfer function of the laser 310 is achieved with respect to the feedback current, in a way which is similar to the one described in connection to FIG. 2, above.

One possible problem of devices 100, 200 and 300 is that the photo detector 131, 231, 331 will also be susceptible to intensity fluctuations in the output power of the laser 110, 210, 310. If these fluctuations become significant they may set limits to the level of frequency noise suppression. If a Mach-Zehnder interferometer is used as the frequency discriminator, the phase difference can be selected so that intensity fluctuations are suppressed. However, a Mach-Zehnder interferometer with this property will be quite bulky.

Figure 4:
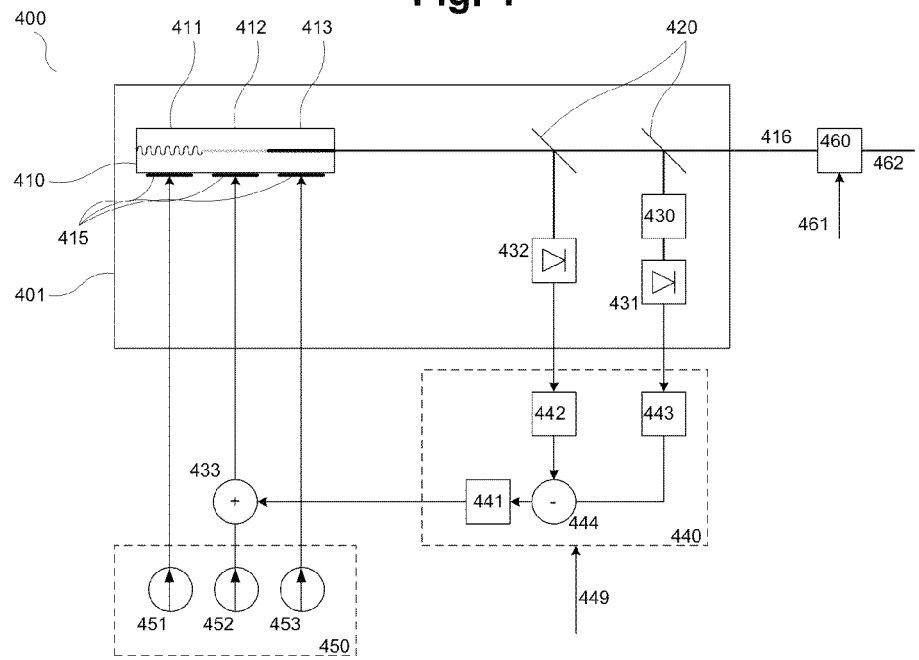
FIG. 4 illustrates the operation principle of a DBR laser device according to a fifth embodiment, with separate light power feedback.
Figure 5:
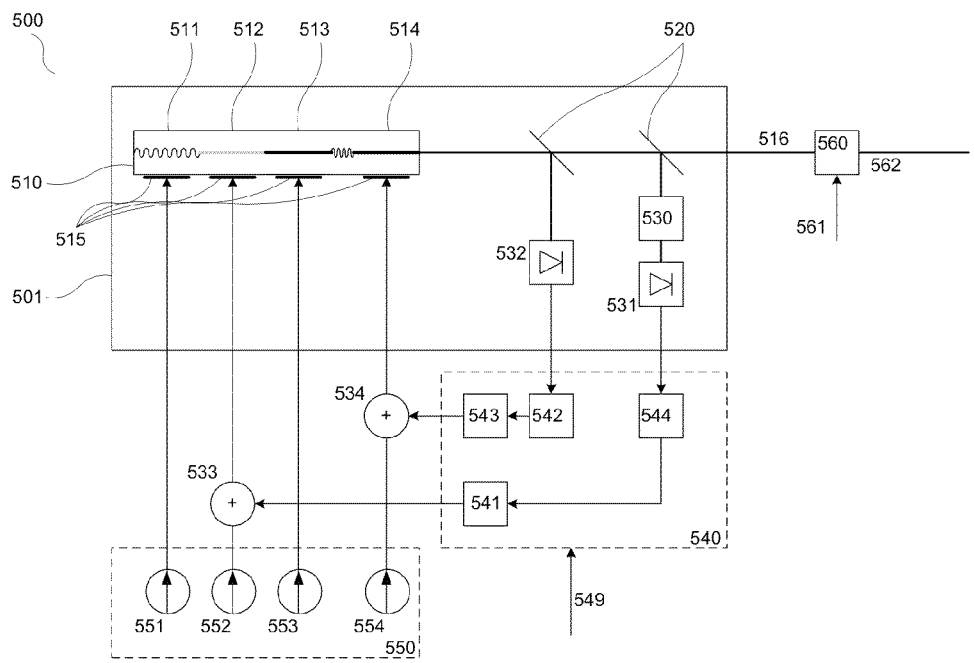
FIG. 5 illustrates the operation principle of a DBR laser device according to a sixth embodiment, with separate light power feedback to a SOA (Semiconductor Optical Amplifier) section.

As an alternative solution to this problem, a setup according to the one shown in FIG. 4 or 5 may be used, which figures are both modeled on FIG. 1a but comprise additional features.

Thus, starting with FIG. 4, a second light intensity detection means 432 is arranged to also read light output from the laser 410, tapped off from beam 416 using one of light splitters 420, and to convert a detected light intensity change into a change in an electrical signal fed to the feedback control means 440.

The feedback control means 440 is, in turn, arranged to adjust the output electrical signal from the frequency noise discriminator using the electrical signal received from detection means 432, whereby a disturbance of the output electrical signal from the frequency noise discriminator 430, 431 arising from an intensity change in the light output by the laser 410 is attenuated. One way of achieving this is to subtract, using summing means 444, the value of the detected light power, which has first been equalized using variable gain amplifier 442, to the signal from amplifier 443, as shown in FIG. 4.

FIG. 5 shows an alternative way of suppressing light intensity fluctuations from the laser 510, which is applicable to a laser 510 having a separate SOA (Semiconductor Optical Amplifier) section 514. In the shown example, the laser 510 also comprises a Bragg section 511, a phase section 512 and a second gain section 513, which three latter sections are used for tuning the laser.

In this case, a separate control loop that suppresses the intensity noise can be implemented, by feeding back the signal from a light intensity detector 532 to the SOA section 514 of the laser 510 rather than using it to compensate the output from discriminator 530, 531.

Thus, in this case the device 500 comprises light intensity detection means 532 arranged to detect an intensity change in light output from the laser 510, tapped off from beam 516 using one of light splitters 520, and to convert the detected intensity change into a change in an electric signal, which electric signal is used to adjust a current fed to the separate optical amplifier section 514 of the laser 510, whereby the change of the output laser light intensity is counteracted. In FIG. 5, the output signal from detector 532 is fed via a variable gain amplifier 542, a separate feedback control means 543 and a summing means 534, arranged to sum the corrective current signal to a constant current supplied from a current source 554.

Figure 12:
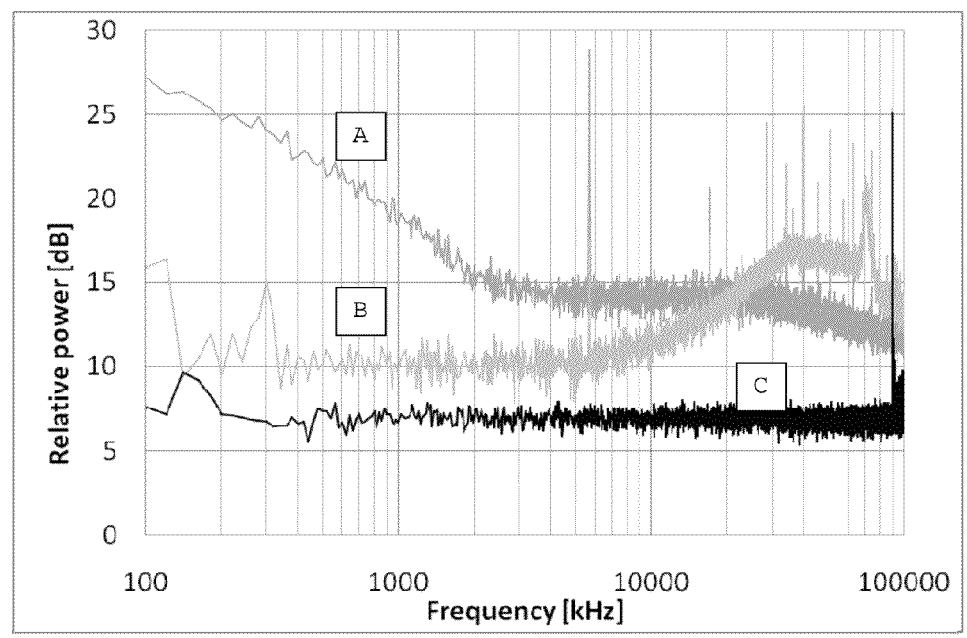
FIG. 12 is a graph showing experimental results for a DBR laser device according to the invention.

FIG. 12 shows actual measurements of the frequency noise from a S7500 tunable laser. Trace A is the frequency noise of the free running laser without an activated feedback loop, in other words the conventional case. Trace B is the frequency noise for the laser with an activated feedback loop according to the invention, in other words the frequency noise for a laser according to the invention. Trace C shows the electronic background noise of the measurement system. Clearly, the feedback loop of the present invention is capable of suppressing the frequency noise up to at least around 25 MHz. Beyond this point the frequency noise is enhanced. This enhancement is not, however, fundamental to the approach, and will vary depending on the actual application and upon the properties of the feedback control system.

The present invention in its various embodiments is especially applicable as a part of a transmitter or a receiver local oscillator in coherent communication systems. In the former case, the corrected output beam 116 (see FIGS. 1a and 1b) acts as a carrier wave on which a data signal 161 modulated, using at least one of, preferably both of, frequency modulation and amplitude modulation. The modulation is carried out by a signal modulation device 160, and results in a modulated output signal 162 comprising the data of the data signal 161. In the latter case, the signal is demodulated using a local oscillator which is aligned with a received laser signal.

The present invention furthermore relates to a method for reducing linewidth and frequency noise in a conventional DBR laser device. Such a conventional DBR laser device 100, 200, 300, 400, 500 typically comprises a DBR laser 110, 210, 310, 410, 510, in turn comprising at least one Bragg section 111, 211, 311, 411, 511, at least one phase section 112, 212, 312, 412, 512 and at least one gain section 113, 214, 313, 413, 513; a laser control means 150, 250, 350, 450, 550, arranged to feed respective tuning currents to the said at least one Bragg section, to the said at least one phase section and to at least one gain section in order to tune the laser to a certain WDM channel. According to this method, to such a laser device is provided a feedback control means 140, 240, 340, 440, 540 and a frequency noise discriminator 130, 131, 230, 231, 330, 331, 430, 431, 530, 531 of the type described herein. Then, the combined arrangement is operated according to the principles as described herein in order to reduce the linewidth and frequency noise of the laser.

Above, preferred embodiments have been described. However, it is apparent to the skilled person that many modifications may be made to the described embodiments without departing from the idea of the invention.

For instance, the embodiment shown in FIG. 1a could be combined with the embodiment shown in FIG. 1b, such that a respective feedback current is applied to both the Bragg 111 and the phase 112 sections. In this case, control circuit 141 will have two outputs.

Other combinations of feeding individual negative feedback currents to a number of passive sections in a DBR laser are envisaged in a similar manner. All of these embodiments can also freely be combined with the FIGS. 4 and 5 embodiments.

Furthermore, other types of DBR lasers, as exemplified in the introductory section above, may be used apart from the simple ones used as examples in FIGS. 1a-5.

Thus, the invention shall not be limited to the described embodiments, but can be varied within the scope of the enclosed claims.

The invention claimed is:

1. A laser device comprising:
   a laser including at least one Distributed Bragg Reflector (DBR) section, at least one phase section, and at least one gain section;
   a laser control means configured to feed respective tuning currents to the at least one DBR section, to the at least one phase section, and to the at least one gain section in order to tune the laser;
   a feedback control means;
   a frequency noise discriminator in communication with the feedback control means, configured to detect a frequency fluctuation in a light beam output from the laser and to communicate a signal representing the frequency fluctuation to the feedback control means, the feedback control means being configured to feed a respective variable electric feedback signal to at least one of the at least one DBR section and the at least one phase section of the laser, so that an output laser frequency is altered in response to a variation in the feedback signal or the combination of respective feedback signals, the feedback signal or the combination of respective feedback signals being varied as a function of the detected frequency fluctuation so as to counteract the detected frequency fluctuation, the feedback control means being configured to receive a signal representing a presently-used Wavelength Division Multiplexed (WDM) channel and/or lasing frequency of the laser, and configured to vary the feedback signal or the combination of feedback signals so that each respective feedback signal amplitude and/or phase depends on the presently-used WDM channel and/or lasing frequency.

2. The laser device according to claim 1, wherein the variable electric feedback signal is a feedback current.

3. The laser device according to claim 1, wherein the variable electric feedback signal is a feedback reverse bias voltage.

4. The laser device according to claim 1, wherein
   the feedback control means is configured to apply at least one of the feedback signal or signals to a certain respective one of the DBR or phase sections in addition to a tuning current that the laser control means is configured to feed to the DBR or phase section to match a presently-used set of tuning current or currents applied to the laser so as to achieve a certain lasing frequency.

5. The laser device according to claim 1, wherein
   the laser comprises at least two phase sections, and the feedback control means is configured to feed the feedback signal to a certain one of said phase sections to which the laser control means is not configured to apply a tuning current to match a presently used set of tuning current or currents applied to the laser so as to achieve a certain lasing frequency.

6. The laser device according to claim 1, wherein
the feedback control means is configured to apply the feedback signal to a certain one of said at least one phase section,
the laser device further comprising a temperature control means configured to control a temperature of the laser so that an optical cavity length of the certain phase section is modified to match a set of tuning currents applied to the laser so as to achieve a certain lasing frequency to which the laser is tuned, the temperature control means being used instead of a tuning current to adjust the optical cavity length of the one certain phase section.

7. The laser device according to claim 1, wherein the feedback control means is configured to vary each of said feedback signal or combination of feedback signals so that the phase of each respective feedback signal in relation to the phase of the detected frequency fluctuation of the presently-used WDM channel and/or lasing frequency.

8. The laser device according to claim 1, wherein the feedback control means comprises
a digital-to-analog converter configured to sample a signal representing the frequency fluctuation,
a digital processor configured to continuously calculate the value of the feedback current or combination of feedback signals based upon the sampled signal and the currently-used lasing frequency and/or WDM channel of the laser, and
an analog-to-digital converter configured to continuously produce the feedback signal or combination of feedback signals to be applied to the phase section.

9. The laser device according to claim 1, wherein the feedback control means comprises an analog circuit comprising
an amplifier
an amplitude and phase conditioner, and
an integrator,
wherein properties of at least the amplitude and phase conditioner are varied depending on the currently-used lasing frequency and/or WDM channel of the laser.

10. The laser device according to claim 1, wherein the frequency noise discriminator comprises
a frequency discriminator means configured to read light output from the laser and to convert a light frequency change into an intensity change in an output light beam, and
a first light intensity detection means configured to read the light beam output from the frequency discriminator means and to convert a detected light intensity change into a change in a first output electrical signal which is communicated to the feedback control means as a signal representing the frequency fluctuation.

11. The laser device according to claim 10, further comprising:
a second light intensity detection means configured to read light output from the laser and to convert a detected light intensity change into a change in a second electrical signal,
wherein the feedback control means is configured to adjust the output electrical signal from the frequency noise discriminator using the second electrical signal, whereby a disturbance of the output electrical signal from the frequency noise discriminator arising from an intensity change in the light output by the laser is attenuated.

12. The laser device according to claim 1, wherein the laser further comprises a separate optical amplifier section,
the device further comprises a light intensity detection means configured to detect an intensity change in light output from the laser and to convert the detected intensity change into a change in an electrical signal, and
the device is configured to adjust a current fed to the separate optical amplifier section of the laser using the electrical signal output from the light intensity detection means, whereby the change of the output laser light intensity is counteracted.

13. The laser device according to claim 1, wherein the laser device is a part of a transmitter in a coherent communication system or a local oscillator in a receiver in a coherent communication system, and
the laser device further comprises a signal modulation device configured to modulate a data signal on the output beam as a carrier wave, using at least one of frequency modulation and amplitude modulation, and to output a modulated output signal comprising data of the data signal.

14. A method for reducing line-width and frequency noise in a laser device including a laser including at least one Distributed Bragg Reflector (DBR) section, at least one phase section, and at least one gain section, the method comprising:
feeding, by a laser control means of the laser device, respective tuning currents to the at least one DBR section, to the at least one phase section, and to the at least one gain section in order to tune the laser;
wherein detecting, by a frequency noise discriminator of the laser device in communication with a feedback control means of the laser device, a frequency fluctuation in a light beam output from the laser, and communicating, by the frequency noise discriminator, a signal representing the frequency fluctuation to the feedback control means;
feeding, by the feedback control means, a respective variable electric feedback signal to at least one of said at least one DBR section and said at least one phase section of the laser, so that an output laser frequency is altered in response to a variation in the feedback signal or the combination of respective feedback signals, the feedback signal or the combination of respective feedback signals being varied as a function of the detected frequency fluctuation so as to counteract the detected frequency fluctuation; and
receiving, by the feedback control means, a signal representing the presently-used lasing frequency and/or Wavelength Division Multiplexed (WDM) channel of the laser, and varying, by the feedback control means, the feedback signal or the combination of feedback signals so that each respective feedback signal amplitude and/or phase depends on the presently-used lasing frequency and/or WDM channel.

15. The method according to claim 14, further comprising applying, by the feedback control means, at least one of said feedback signal or signals to a certain respective one of said DBR or phase sections in addition to a tuning current that the laser control means is configured to feed to the DBR or the phase section to match a presently-used set of tuning current or currents applied to the laser so as to achieve a certain lasing frequency.

16. The method according to claim 14, wherein the laser comprises at least two phase sections, and the method further comprising feeding, by the feedback control means, the feedback signal to a certain one of said phase sections to which the laser control means is not configured to apply a tuning current to match a presently-used set of tuning current or currents applied to the laser so as to achieve a certain lasing frequency.

17. The method according to claim 14, further comprising:
applying, by the feedback control means, the feedback signal to a certain one of said at least one phase section, and
controlling, by a temperature control means a temperature of the laser so that an optical cavity length of the said certain phase section is modified to match a set of tuning currents applied to the laser so as to achieve a certain lasing frequency to which the laser is tuned, the temperature control means being used instead of a tuning current to adjust the optical cavity length of the one certain phase section.

18. The method according to claim 14, further comprising varying, by the feedback control means, each of the feedback signal or combination of feedback signals so that the phase of each respective feedback signal in relation to the phase of the detected frequency fluctuation depends on the presently-used WDM channel and/or lasing frequency.

19. The method according to claim 14, wherein the laser device is a part of a transmitter in a coherent communication system or a local oscillator in a receiver in a coherent communication system, and
the laser device comprises a signal modulation device configured to modulate a data signal on the output beam as a carrier wave, using at least one of frequency modulation and amplitude modulation, and configured to output a modulated output signal including data of the data signal.

* * * * *